US007190942B1

(12) United States Patent
Nise

(10) Patent No.: US 7,190,942 B1
(45) Date of Patent: Mar. 13, 2007

(54) EFFICIENT POLYPHASE FILTER HAVING A COMPACT STRUCTURE

(75) Inventor: Benjamin E. Nise, Plano, TX (US)

(73) Assignee: Microtune (Texas) L.P., Plano, TX (US)

(*) Notice: Subject to any disclaimer, the term of this patent is extended or adjusted under 35 U.S.C. 154(b) by 666 days.

(21) Appl. No.: 10/145,443

(22) Filed: May 14, 2002

(51) Int. Cl.
*H04B 1/40* (2006.01)
(52) U.S. Cl. .................. 455/307; 455/318; 333/172; 716/10
(58) Field of Classification Search ................ 455/209, 455/216, 255, 296, 306, 323, 307, 318, 317, 455/319; 333/167, 172, 168, 138, 156; 716/9, 716/10, 14
See application file for complete search history.

(56) References Cited

U.S. PATENT DOCUMENTS

| 4,123,712 | A | * | 10/1978 | Mikhael | ................. | 455/109 |
| 4,749,969 | A | * | 6/1988 | Boire et al. | ................. | 333/120 |
| 6,529,100 | B1 | * | 3/2003 | Okanobu | ................. | 333/172 |
| 6,696,885 | B2 | * | 2/2004 | Christensen | ................. | 327/552 |

FOREIGN PATENT DOCUMENTS

JP       02003234406 A  *  8/2003
WO      WO 01/28310        4/2001

OTHER PUBLICATIONS

Behbahani, Farbod et al., "CMOS Mixers and Polyphase Filters for Large Image Rejection," IEEE Journal of Solid-State Circuits, vol. 36, No. 6, Jun. 2001, pp. 873-887.

Crols, Jan et al., "A Single-Chip 900 MHz CMOS Receiver Front-End With a High Performance Low-IF Topology," IEEE Journal of Solid-State Circuits, vol. 30, No. 12, Dec. 1995, pp. 1483-1492.

Green, Rod et al., "High Performance Direct Conversion," Electronics World + Wireless World, Jan. 1996, Sutton, Surrey, GB, pp. 18-22.

Gingell, M. J., "Single Sideband Modulation Using Sequence Asymmetric Polyphase Networks," Electrical Communication, vol. 48, No. 1and 2, 1973, pp. 21-25.

International Search Report Issued for PCT/US03/14303, dated Oct. 14, 2004.

Declaration of Pre-Filing Activity (attached as Exhibit "A").

* cited by examiner

*Primary Examiner*—Edward F. Urban
*Assistant Examiner*—Blane J. Jackson
(74) *Attorney, Agent, or Firm*—Fulbright & Jaworski LLP

(57) ABSTRACT

Disclosed are systems and methods which provide phase shifting of signals while minimizing signal attenuation associated with providing such phase shifting. Preferred embodiments provide a compact polyphase filter structure in which the geometry of the polyphase filter both minimizes parasitic capacitance and signal transmission paths therein. A polyphase filter of a preferred embodiment utilizes a radial pinwheel structure providing a geometry in which successive circuit components are disposed very near one another and in an orientation to accommodate very short connections therebetween. Embodiments may include the use of a buffer at the outputs of the polyphase filter circuit to reduce the amount of parasitics associated with the polyphase filter.

56 Claims, 3 Drawing Sheets

EFFICIENT POLYPHASE FILTER HAVING A COMPACT STRUCTURE

BACKGROUND OF THE INVENTION

It is often desirable to provide a controlled phase shift with respect to a signal. For example, radio frequency (RF) circuits often utilize 90° phase differentials with respect to a signal, e.g., in-phase (I) and quadrature (Q) signal components, to provide desired signal processing. One circuit using such 90° phase differentials is a single sideband mixer, typically using 2 90° phase shifters in order provide I and Q components with respect to a carrier signal and I and Q components with respect to a local oscillator (LO) signal. Through proper phase shifting and combining of the signals (destructive combining of undesired frequencies e.g., sidebands and/or images), such a single sideband mixer can be utilized to cancel undesired frequencies.

To suppress undesired frequencies through destructive combining, the 90° phase differentials utilized by the single sideband mixer should be very accurate. Likewise, the amplitudes of the signal components for which destructive combining is desired should be very close.

The aforementioned 90° phase differentials have often been provided using a polyphase filter circuit. Such circuits are typically embodied as a resistor and capacitor (RC) network, where the number of stages of resistors and capacitors determines the accuracy of the phase shift provided. However, there is parasitic capacitance associated with every node in such a circuit. At high frequencies, parasitic capacitance will cause attenuation of an RF signal as it passes through the network. For example, for a polyphase filter operating with an RF signal having a characteristic frequency of about 2 GHz, 7 dB of attenuation is not uncommon.

Moreover, the amount of parasitic capacitance and transmission delays associated with various signal paths within the polyphase filter must be carefully matched in order to provide an accurate phase shift output. Such matching concerns have typically been addressed in the prior art by providing excess signal path portions, thereby resulting in a complex and large polyphase filter structure.

Accordingly, a need exists in the art for polyphase filters adapted to provide a desired phase shift with a minimal amount of signal attenuation. Moreover, there is a need in the art for the structure of such polyphase filters to be compact.

BRIEF SUMMARY OF THE INVENTION

The present invention is directed to systems and methods which provide phase shifting of signals while minimizing signal attenuation associated with providing such phase shifting. A most preferred embodiment of the present invention provides a compact polyphase filter structure in which the geometry of the polyphase filter both minimizes parasitic capacitance and signal transmission paths therein.

A preferred embodiment polyphase filter of the present invention utilizes a radial pinwheel structure. This preferred embodiment structure provides a geometry in which successive circuit components, e.g., resistors and capacitors, are disposed very near one another and in an orientation to accommodate very short connections therebetween. Accordingly, this embodiment of the invention does not require large routing signal paths going from component to component.

According to a preferred embodiment pinwheel structure polyphase filter, input signals are routed into the center of the pinwheel. The signals therefore start at the center of the pinwheel structure and propagate outward through the polyphase filter components disposed in a radial configuration. Accordingly, the last stage of the polyphase filter of this embodiment is preferably at or near the circumference of the pinwheel structure.

The preferred embodiment radial pinwheel polyphase filter structure provides several advantages over a typical polyphase filter structure. For example, the structure results in much less attenuation because the signal paths from device to device become much smaller. Additionally, such an embodiment provides synergism with respect to circuit geometry, facilitating a lay out in which parasitics are not only reduced but are also matched. Accordingly, preferred embodiments of the present invention have been able to provide phase shift differentials of 90° with respect to signals in the 2 GHz frequency range resulting in approximately 1 dB of attenuation associated with the polyphase filter circuit, as compared to approximately 7 dB of attenuation as is common with a typical prior art polyphase filter of conventional design.

An embodiment of the present invention includes the use of a buffer at the outputs of the polyphase filter circuit. For example, an emitter follower buffer may be placed at the 4 corners of a preferred embodiment pinwheel structure polyphase filter structure to provide buffering of the signals output therefrom. Such buffers may be utilized to reduce the amount of parasitics associated with the polyphase filter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 1:
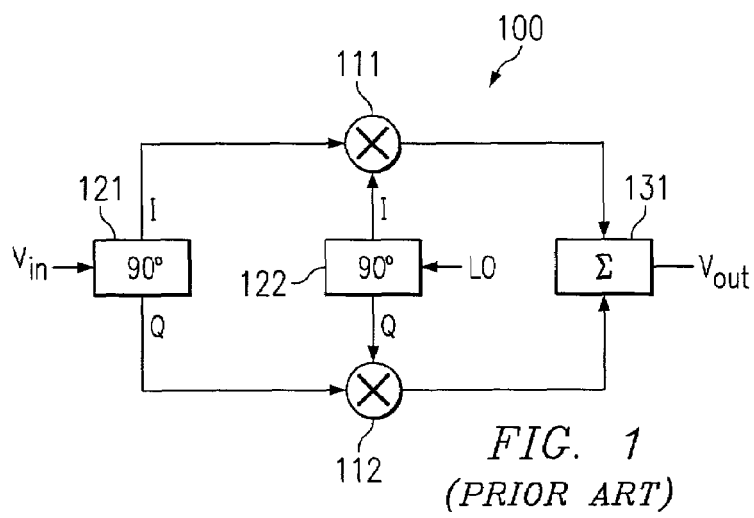
FIG. 1 shows a block diagram of a conventional single sideband mixer.

Directing attention to FIG. 1, a single sideband mixer is shown as mixer 100. As is well known in the art, a single sideband mixer utilizes 90° phase differentials to cancel a signal sideband and/or image associated with the mixing of signals of different frequencies. An input signal, here Vin having a first characteristic frequency, may be down-converted or up-converted to provide an output signal, here Vout having a second characteristic frequency, while undesired frequencies associated with the mixing of Vin with the local oscillator signal (LO) are canceled.

Accordingly, single sideband mixer 100 includes first 90° phase shifter 121 providing in-phase (I) and quadrature (Q) components of the input signal Vin. Similarly, second 90° phase shifter 122 provides I and Q components of the LO signal. Mixer 111 combines the I component of Vin with the I component of LO to thereby provide both fLO+fVin and fLO−fVin, wherein fLO is the characteristic frequency of the LO signal and fvin is the characteristic frequency of Vin as input to mixer 100. Similarly, mixer 112 combines the Q component of Vin with the Q component of LO to thereby provide both fLO+fVin and fLO−fVin. However, because of the phase differential between the signals input to mixer 111 and 112, the undesired sideband signal LO−fVin in the output stream of mixers 111 and 112 destructively combine in mixer 131 because they have a 180° phase differential therebetween. Accordingly, the output of combiner 131 is a constructive combination of the desired signals fLO+fVin from mixers 111 and 112 because these signal components are in phase with one another.

From the above discussion, it should be readily appreciated that providing a relatively precise phase differential, to thereby provide accuracy with respect to the aforementioned 180° phase differential as well as to provide accuracy with respect to the phase of the signals to constructively combine, suggests that the phase shifts provided by phase shifters 121 and 122 should be precise. That is, the quality of the 90° phase shift has to be very good in order to have acceptable side bands for suppression.

Figure 2:
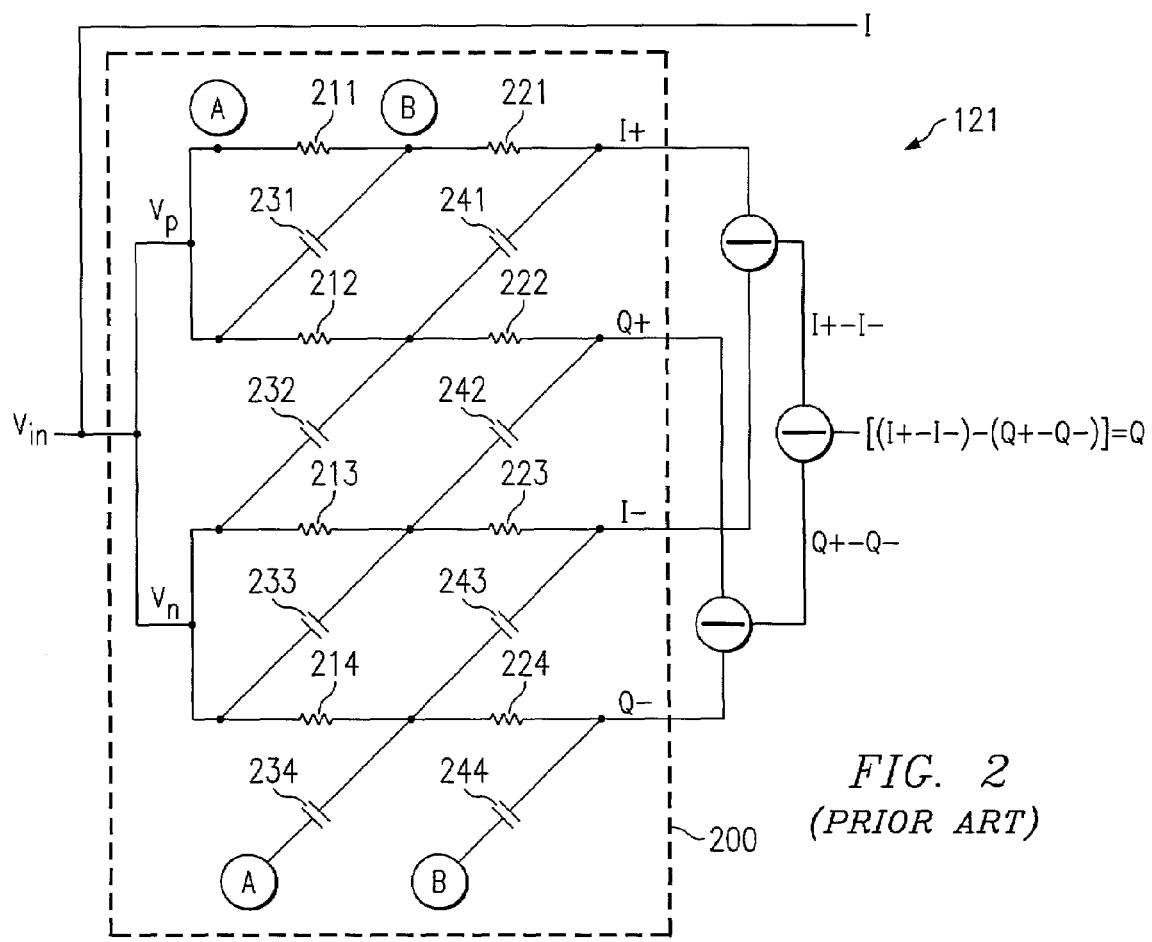
FIG. 2 shows a schematic diagram of a polyphase filter according to the prior art.

One method for providing the aforementioned 90° phase shifts has been to utilize a polyphase filter. Directing attention to FIG. 2, a schematic diagram of a conventional polyphase filter is shown as polyphase filter 200. Polyphase filter 200 comprises a multi stage resistor and capacitor (RC) network. Specifically, resistors 211–214 and capacitors 231–234 comprise a first stage of multi stage polyphase filter 200. Similarly, resistors 221–224 and capacitors 241–244 comprise a second stage of multi stage polyphase filter 200. It should be appreciated that, as more stages are added to the network, the resulting polyphase filter will provide a more accurate phase shift. Accordingly, although only 2 stages are shown, a polyphase filter may include more such stages, depending upon the desired accuracy of the phase shift provided. However, as discussed below, conventional implementations of polyphase filters result in substantial attenuation of signals and, therefore, may practically limit the number of stages which may be implemented.

Although conventional polyphase filters may be utilized to provide phase shifting suitable for use in many applications, such as the aforementioned single sideband mixer, their use is not without problems. For example, typical implementations of the polyphase filter circuitry of FIG. 2 results in introduction of a significant amount of attenuation with respect to a signal applied thereto. Such signal attenuation is particularly undesirable as it both reduces the performance of the system as well as results in a more noisy circuit.

Signal attenuation associated with polyphase filter 200 results at least in part due to parasitic capacitance attached to every node in the circuit from any point in the circuit to ground. At high frequencies, such parasitic capacitance will cause attenuation through the network. Moreover, techniques that have been used to layout such a filter network in the past have caused the potential for an appreciable amount of attenuation in the network from parasitic capacitance associated with signal path geometry.

Figure 3:
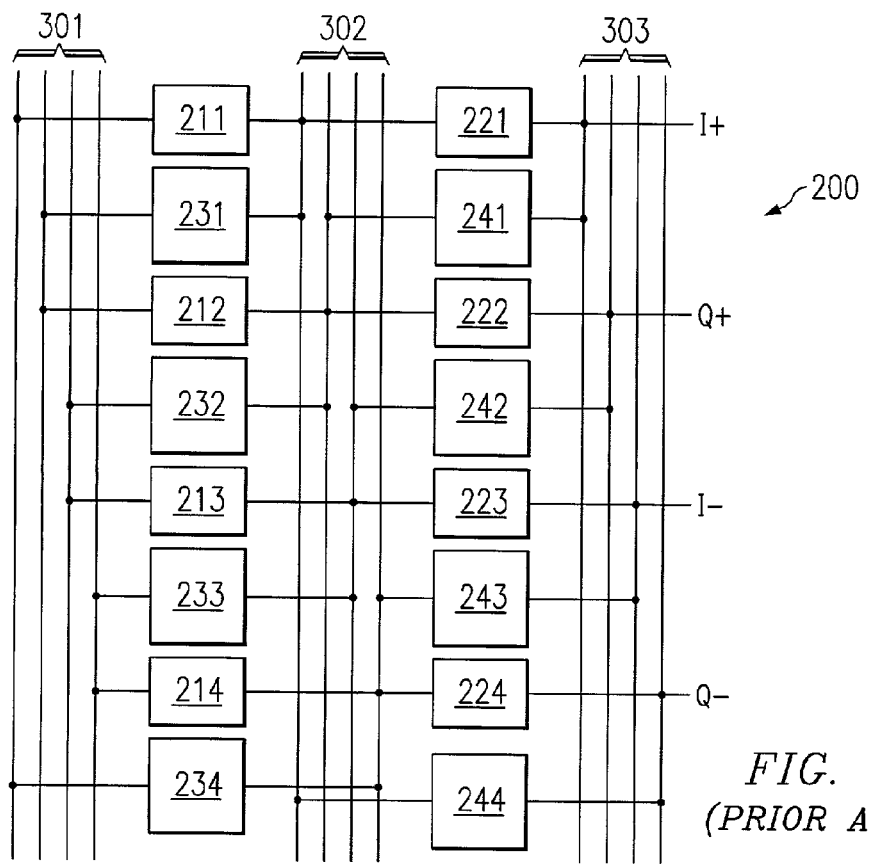
FIG. 3 shows a block diagram of a prior art implementation of a polyphase filter according to the prior art.

Directing attention to FIG. 3, a typical polyphase filter circuit configuration is shown. Specifically, the stages of multi stage polyphase filter 200 are disposed in columns, wherein a first column includes the resistors and capacitors of the first stage and a second column includes the resistors and capacitors of the second stage. Before, after, and between these columns of resistors and capacitors are routing channels (routing channels 301–303) that consist of signal feed busses. The number of signal feed busses utilized in each routing channel corresponds to the number of RC circuits (rows) in each stage, here 4. From these routing channels it is possible to connect the resistors and capacitors in the circuit configuration of FIG. 2. However, it should be appreciated that such routing channels contained a high amount of parasitic capacitance which, as described above, results in attenuation at high frequencies.

An additional disadvantage of the polyphase filter circuit configuration shown in FIG. 3 is that circuit must be matched, i.e., the signal paths for each signal component should have a same signal propagation delay and impedance associated therewith, in order to achieve better phase and amplitude matching. An imbalance in signal paths from row to row will degrade the desired 90° phase shift. The routing channels shown in FIG. 3 consist of four wires wherein the inner wires experience one parasitic environment from line to line, but the outer two lines have a different parasitic environment. Specifically, the internal lines experience parasitic capacitance associated with two neighboring wires whereas the external lines experience parasitic capacitance associated with one neighboring wire each. Accordingly, implementations of the configuration shown in FIG. 3 include excess routing in order to achieve good matching.

Figure 4:
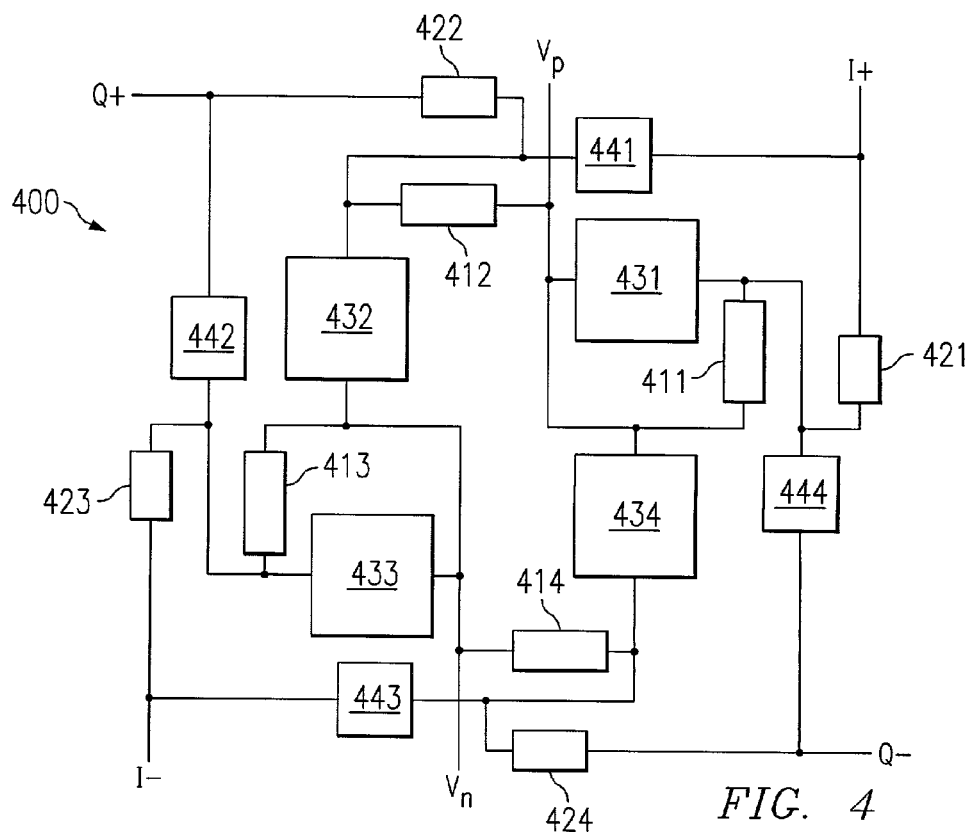
FIG. 4 shows a block diagram of a polyphase filter having a radial configuration according to an embodiment of the present invention.

Directing attention to FIG. 4, an embodiment of a polyphase filter configuration according to the present invention is shown as multi stage polyphase filter 400. Polyphase filter 400 is configured to provide an RC network, such as may be utilized in single sideband mixer 100, substantially as that shown in FIG. 2. Accordingly, polyphase filter 400 includes resistors 411–414 and capacitors 431–434 comprising a first stage and resistors 421–424 and capacitors 441–444 comprising a second stage. However, it should be appreciated that the components of polyphase filter 400 are disposed in a radial pinwheel configuration. Preferred embodiments of such a radial configuration provide symmetry with respect to the polyphase filter circuit and, therefore, facilitate signal path matching.

That is, in the preferred embodiment pinwheel structure, each radial segment may be matched such that all radial segments experience the same parasitic environment as each of its neighbors.

Moreover, the preferred embodiment radial configuration provides flexibility with respect to positions of nodes at which particular components are coupled, providing flexibility with respect to implementing a desired configuration. For example, it may be desired to provide a slightly different layout than that shown in FIG. 4, such as providing a slightly different placement of the resistors of one or more stages, in order to get a better fit. The particular layout chosen may be based upon such consideration such as the geometries of the individual circuit components, e.g., resistors and capacitors, used etcetera.

According to a preferred embodiment of the present invention, signals input into the polyphase filter are brought to the center of the radial structure. For example, in the embodiment of FIG. 4, input signals Vp and Vn are brought into the center of polyphase filter 400 where they are coupled to resistors 411 and 412 and resistors 413 and 414, respectively, of the first stage. Similarly, capacitors 431 and 434 and 432 and 433 of the first stage are coupled to the Vp and Vn input signal paths, respectively. In each succeeding stage of capacitors of the preferred embodiment, the output of the capacitors are routed radially, thereby establishing a pinwheel configuration. The signals propagate through the components of the polyphase filter toward the periphery of the structure where signal components I+, Q+, I−, and Q− are output.

Preferred embodiment polyphase filter structures dispose input signals toward the center of the radial structure to accommodate a compact design utilizing geometries of the preferred embodiment components. For example, it may be desired to minimize the amount of voltage loss associated with the use of the polyphase filter and, therefore, a circuit geometry may be adopted in which the impedance of circuit components of each successive stage of the polyphase filter are increased. Accordingly, disposing input signals toward the center of the radial structure accommodates a geometry in which the larger impedance capacitors (expected to be the largest components of the filter circuit) are disposed toward the center of the radial structure with smaller impedance capacitors disposed more toward the circumference of the radial structure. Such a configuration is illustrated in FIG. 4, wherein larger ones of the components are placed at the center of the structure. It should be appreciated that the illustrated embodiment of FIG. 4 utilizes the geometries of the components to provide an efficient circuit foot print.

Of course, other layouts may be used according to the present invention, if desired. For example, where current loss is to be minimized, a circuit of the present invention may utilize decreased impedance of components of successive stages. Such an alternative embodiment may, for example, dispose the polyphase filter inputs toward the circumference of the radial structure and the outputs towards the center.

The radial or spiraling routing is utilized according to the preferred embodiment to provide for small parasitics in the polyphase filter circuit. For example, the distances signals are routed are reduced according to the preferred embodiment radial structure as compared a conventional implementation. Moreover, preferred embodiments of the present invention eliminate the use of routing channels which have substantial parasitics associated therewith due to their parallel line configuration. Accordingly, polyphase filters implementing a radial configuration such as that illustrated in FIG. 4 have resulting in providing a desired phase shift with only approximately 1 dB of attenuation associated with the polyphase filter circuit, as compared to approximately 7 dB of attenuation as is common with a typical prior art polyphase filter design.

Figure 5:
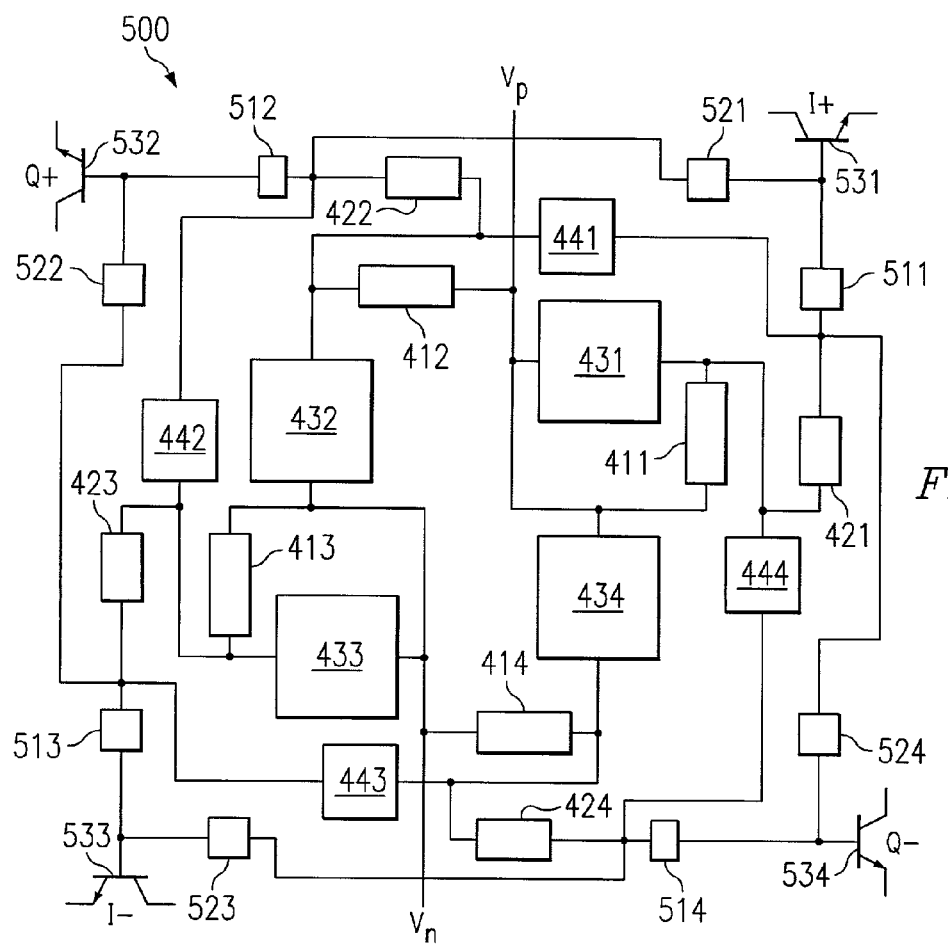
FIG. 5 shows a block diagram of a polyphase filter having a radial configuration according to an alternative embodiment of the present invention.

It should be appreciated that polyphase filters of the present invention are not limited to the configuration illustrated in FIG. 4. For example, there is no limitation to a polyphase filter of the present invention including 2 stages. Directing attention to FIG. 5, an alternative embodiment polyphase filter is shown having 3 stages. Specifically, polyphase filter 500 of FIG. 5 is configured substantially as polyphase filter 400 of FIG. 4, having a third stage defined by resistors 511–514 and capacitors 521–524. The additional stage of polyphase filter 500 may be utilized to provide desired precision with respect to the phase shift provided thereby where such precision may not be possible with a conventional implementation due to attenuation of the signals propagating through the network.

Also shown in the embodiment of FIG. 5 are buffers 531–534. Specifically, buffers 531–534 of the illustrated embodiment are emitter followers placed at the 4 corners of the radial structure polyphase filter to provide buffering of the signals output therefrom. Such buffers may be utilized to reduce the amount of parasitics associated with the last stage of the polyphase filter. Specifically, once the signal passes through the output buffers, a very long signal path may be driven because the impedance on the output line has been reduced.

Figure 6:
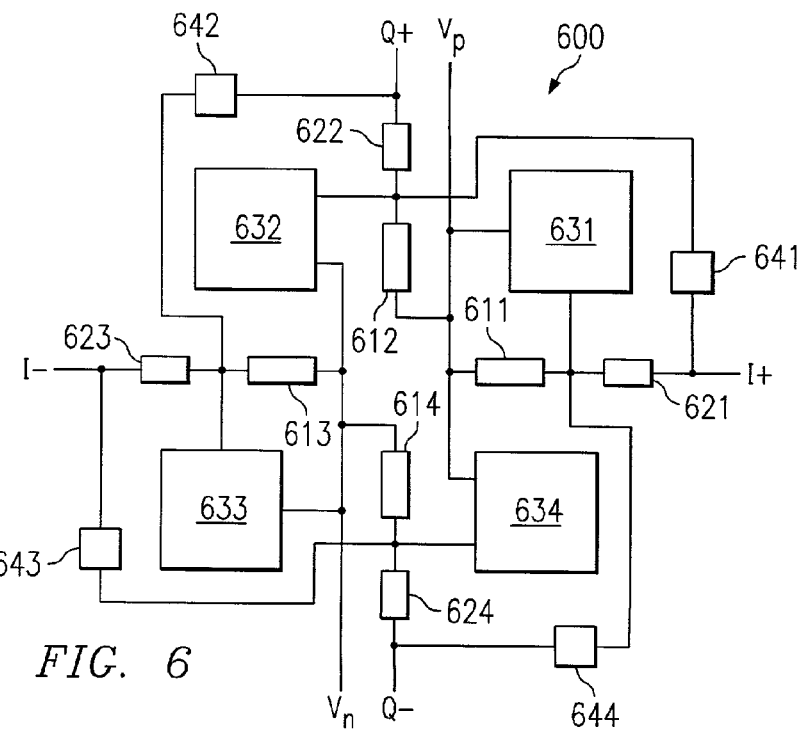
FIG. 6 shows a block diagram of a polyphase filter having a radial configuration according to another alternative embodiment of the present invention.

Another alternative embodiment of the present invention is shown in FIG. 6. Polyphase filter 600 of FIG. 6 is configured to provide an RC network in a radial configuration substantially as that shown in FIG. 4. Accordingly, polyphase filter 600 includes resistors 611–614 and capacitors 631–634 comprising a first stage and resistors 621–624 and capacitors 641–644 comprising a second stage. However, it should be appreciated that the components of polyphase filter 600 are disposed somewhat differently than those of FIG. 4, although still providing a radial configuration according to the present invention. Specifically, in the configuration of FIG. 6, the resistors of the first and second stages are disposed between the relatively large capacitors of the first stage. Accordingly, it should readily be appreciated that a number of particular layouts may be utilized in providing a radial structure according to the present invention.

Although preferred embodiments have been described herein with respect to input signals being provided toward the center of a radial structure, it should be appreciated that the present invention is not so limited. Accordingly, embodiments of the present invention may utilize a radial structure in which inputs are introduced to the circuit at the periphery with outputs thereof appearing toward the center of the radial structure. For example, the circuitry of FIG. 4 may be utilized in providing a phase combiner, in which case input signals would be introduced along the periphery and the phase combined signals made available toward the center of the radial structure.

It should be appreciated that polyphase filters of the present invention may be implemented using a variety of technologies. For example, discrete components may be utilized in providing an RC network according to the present invention. However, a most preferred embodiment of the present invention provides an integrated circuit implementation polyphase filter in which resistors and capacitors thereof are disposed on a common substrate. For example, capacitors utilized in a polyphase filter of the present invention may be provided as conductive plates disposed in strata of a monolithic substrate. The values of such capacitors may be determined through such attributes as size, spacing, and/or coupling a plurality of capacitors in series or parallel, as is well known in the art. Resistors utilized in a polyphase filter of the present invention may be provided, for example, as doped strips disposed in the monolithic substrate. The value of such resistors may be determined through such attributes as the amount of doping, the length of the strip, and/or coupling a series of resistors in series or parallel.

Although preferred embodiments of the present invention have been described above with reference to resistors and capacitors of an RC network, there is no limitation to the use of such components according to the present invention. For example, radial circuit structure of the present invention may be utilized with resistors and inductors to provide a pinwheel configuration LC network, if desired.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for providing controlled phase shifting of a signal, said system comprising:
a polyphase filter having at least a plurality of first components and a plurality of second components, wherein ones of said first components are coupled to ones of said second components, wherein said plurality of first components are disposed in a radial configuration, wherein said radial configuration of said plurality of first components comprises a first set of said first components, and wherein said radial configuration of said plurality of first components comprises a plurality of radial signal paths in which said first set of said first components are coupled to a first set of second components, wherein said plurality of first components comprises at least four first components and said plurality of second components comprises at least four second components.

2. The system of claim 1, wherein said plurality of radial signal paths each comprise an output of one of said first components and said second components routed radially to establish a pinwheel configuration of said polyphase filter.

3. A system for providing controlled phase shifting of a signal, said system comprising:
a polyphase filter having at least a plurality of first components and a plurality of second components, wherein ones of said first components are coupled to ones of said second components, wherein said plurality of first components are disposed in a radial configuration, wherein said radial configuration of said plurality of first components comprises a first set of said first components disposed within a first circumference, and wherein said plurality of first components further comprises a second set of said first components disposed within a second circumference.

4. The system of claim 3, wherein said first circumference is smaller than said second circumference.

5. The system of claim 3, wherein said first circumference is larger than said second circumference.

6. The system of claim 3, wherein said plurality of second components are disposed in a radial configuration.

7. The system of claim 3, wherein said plurality of second components comprises a first set of second components interleaved with said first set of first components disposed in said radial configuration.

8. The system of claim 3, wherein a signal input to said polyphase filter is coupled to one or more components of said plurality of first components and said plurality of second components near a periphery of said radial configuration.

9. The system of claim 3, wherein said plurality of first components and said plurality of second components are disposed upon a same substrate to thereby implement said polyphase filter as an integrated circuit.

10. The system of claim 3, wherein said plurality of first components comprise capacitors.

11. The system of claim 3, wherein said radial configuration utilizes a geometry of said first components and said second components to provide a small footprint.

12. The system of claim 3, wherein said controlled phase shifting is utilized in a single sideband mixer.

13. The system of claim 3, wherein said controlled phase shifting is utilized in an image reject mixer.

14. The system of claim 3, wherein said radial configuration of said plurality of first components comprises a plurality of radial signal paths in which said first set of said first components are coupled to a first set of second components.

15. The system of claim 14, wherein said plurality of radial signal paths each comprise a spiral signal path.

16. A system for providing controlled phase shifting of a signal, said system comprising:
a polyphase filter having at least a plurality of first components and a plurality of second components, wherein ones of said first components are coupled to ones of said second components, wherein said plurality of first components are disposed in a radial configuration, wherein said radial configuration of said plurality of first components comprises a first set of said first components disposed within a first circumference, wherein said plurality of second components are disposed in a radial configuration, wherein said radial configuration of said plurality of second components comprises a first set of said second components disposed within a third circumference.

17. The system of claim 16, wherein said first circumference is smaller than said third circumference.

18. The system of claim 16, wherein said first circumference is larger than said third circumference.

19. A system for providing controlled phase shifting of a signal, said system comprising:
a polyphase filter having at least a plurality of first components and a plurality of second components, wherein ones of said first components are coupled to ones of said second components, wherein said plurality of first components are disposed in a radial configuration, wherein a signal input to said polyphase filter is coupled to one or more components of said plurality of first components and said plurality of second components near a center of said radial configuration.

20. The system of claim 19, wherein a signal output from said polyphase filter is provided by one or more components of said plurality of first components and staid plurality of second components near a periphery of said radial configuration.

21. A system for providing controlled phase shifting of a signal, said system comprising:
a polyphase filter having at least a plurality of first components and a plurality of second components, wherein ones of said first components are coupled to ones of said second components, wherein said plurality of first components are disposed in a radial configuration, wherein a signal input to said polyphase filter is coupled to one or more components of said plurality of first components and said plurality of second components near a periphery of said radial configuration, wherein a signal output from said polyphase filter is provided by one or more components of said plurality of first components and said plurality of second components near a center of said radial configuration.

22. A system for providing controlled phase shifting of a signal, said system comprising:
a polyphase filter having at least a plurality of first components and a plurality of second components, wherein ones of said first components are coupled to ones of said second components, wherein said plurality of first components comprises at least four first components and said plurality of second components comprises at least four second components, wherein said plurality of first components are disposed in a radial configuration, wherein said plurality of second components comprise resistors.

23. A system for providing controlled phase shifting of a signal, said system comprising:
a polyphase filter having at least a plurality of first components and a plurality of second components, wherein ones of said first components are coupled to ones of said second components, wherein said plurality of first components are disposed in a radial configuration, wherein said radial configuration implements a geometry in which larger ones of said first components are disposed toward a center of said radial configuration.

24. A method for providing controlled phase shifting of a signal, said system comprising:
providing a plurality of first components disposed in a radial configuration; and
providing a plurality of second components coupled to ones of said first components to thereby define a polyphase filter circuit, further comprising inputting a signal for which said controlled phase shifting is desired to one or more components of said plurality of first components and said plurality of second components near a center of said radial configuration.

25. The method of claim 24, wherein providing said plurality of first components comprises disposing a first set of said first components within a first circumference.

26. The method of claim 25, wherein providing said plurality of second components comprises coupling a first set of said second components to corresponding components of said first set of first components using radial signal paths.

27. The method of claim 25, wherein providing said plurality of second components comprises disposing said plurality of second components in a radial configuration.

28. The method of claim 25, wherein said providing said plurality of second components comprises interleaving a first set of second components with said first set of first components.

29. The method of claim 24, further comprising outputting a signal having said controlled phase shift from one or more components of said plurality of first components and said plurality of second components near a periphery of said radial configuration.

30. The method of claim 24, wherein said providing said plurality of first components comprises disposing said first components and said second components upon a same substrate to thereby implement said polyphase filter circuit as an integrated circuit.

31. The method of claim 24, wherein said plurality of first components comprise capacitors.

32. The method of claim 24, wherein said controlled phase shifting is utilized in a single sideband mixer.

33. The method of claim 24, wherein said controlled phase shifting is utilized in an image reject mixer.

34. A method for providing controlled phase shifting of a signal, said system comprising:
providing a plurality of first components disposed in a radial configuration; and
providing a plurality of second components coupled to ones of said first components to thereby define a polyphase filter circuit, wherein providing said plurality of first components comprises disposing a first set of said first components within a first circumference, wherein said providing said plurality of second components comprises coupling a first set of said second components to corresponding components of said first set of first components using radial signal paths, wherein said radial signal paths each provide a signal path portion wherein an output of said first set of said second components and said first set of first components is routed radially to establish a pinwheel configuration of said polyphase filter.

35. A method for providing controlled phase shifting of a signal, said system comprising:
providing a plurality of first components disposed in a radial configuration; and
providing a plurality of second components coupled to ones of said first components to thereby define a polyphase filter circuit, wherein providing said plurality of first components comprises disposing a first set of said first components within a first circumference, wherein providing said plurality of first components further comprises disposing a second set of said first components within a second circumference.

36. The method of claim 35, wherein said first circumference is smaller than said second circumference.

37. The method of claim 35, wherein said first circumference is larger than said second circumference.

38. A method for providing controlled phase shifting of a signal, said system comprising:
providing a plurality of first components disposed in a radial configuration; and
providing a plurality of second components coupled to ones of said first components to thereby define a polyphase filter circuit, wherein providing said plurality of first components comprises disposing a first set of said first components within a first circumference, wherein said providing said plurality of second components comprises disposing said plurality of second components in a radial configuration, wherein providing said plurality of second components comprises disposing a first set of said second components within a third circumference.

39. The method of claim 38, wherein said first circumference is smaller than said third circumference.

40. The method of claim 38, wherein said first circumference is larger than said third circumference.

41. A method for providing controlled phase shifting of a signal, said system comprising:
providing a plurality of first components disposed in a radial configuration; and
providing a plurality of second components coupled to ones of said first components to thereby define a polyphase filter circuit, and further comprising outputting a signal having said controlled phase shift from one or more components of said plurality of first components and said plurality of second components near a center of said radial configuration.

42. The method of claim 41, further comprising inputting a signal for which said controlled phase shifting is desired to one or more components of said plurality of first components and said plurality of second components near a periphery of said radial configuration.

43. A method for providing controlled phase shifting of a signal, said system comprising:
providing a plurality of first components disposed in a radial configuration;
providing a plurality of second components coupled to ones of said first components to thereby define a polyphase filter circuit, wherein said plurality of second components comprise resistors; and
inputting a signal for which said controlled phase shifting is desired to one or more components of said plurality of first components and said plurality of second components near a center of said radial configuration.

44. A circuit for providing a desired amount of phase shift to a signal, said circuit comprising:
a plurality of first components disposed in a radial configuration; and
a plurality of second components disposed in a radial configuration, wherein ones of said first and second components are coupled in series such that said radial configurations provide a signal path wherein an output of said ones of said first and second components is routed radially to establish a pinwheel configuration of a polyphase filter.

45. The circuit of claim 44, wherein ones of said fist components are interleaved with ones of said second components.

46. The circuit of claim 44, wherein said circuit defines a filter network.

47. The circuit of claim 46, wherein said first components are capacitors and said second components are resistors.

48. The circuit of claim 46, wherein said filter network comprises two or more stages.

49. The circuit of claim 46, wherein said filter network comprises three or more stages.

50. The system of claim 49, wherein said first components are capacitors and said second components are resistors.

51. The system of claim 48, wherein said first components are capacitors and said second components are resistors.

52. The circuit of claim 44, wherein said circuit is disposed in a tuner circuit.

53. The circuit of claim 51, wherein said tuner circuit comprises a single sideband mixer.

54. A filter network circuit comprising:
a plurality of capacitors disposed in a radial configuration; and
a plurality of resistors disposed in a radial configuration, wherein ones of said capacitors and said resistors are coupled in series such that said radial configurations provide a signal path wherein an output of said ones of said capacitors and said resistors is routed radially to establish a pinwheel configuration of a polyphase filter.

55. The circuit of claim 54, wherein said circuit is disposed in a system to provide a desired amount of phase shift with respect to an input signal.

56. The circuit of claim 54, wherein said circuit is disposed in a system to provide phase combining of a plurality of input signals.

* * * * *